(12) United States Patent
Li et al.

(10) Patent No.: US 6,238,512 B1
(45) Date of Patent: May 29, 2001

(54) PLASMA GENERATION APPARATUS

(75) Inventors: Yunlong Li, Tokyo; Noriyoshi Sato; Satoru Iizuka, both of Sendai, all of (JP)

(73) Assignees: Hitachi Kokusai Electric Inc., Tokyo; Noriyoshi Sato, Miyagi-ken, both of (JP)

( * ) Notice: Subject to any disclaimer, the term of this patent is extended or adjusted under 35 U.S.C. 154(b) by 0 days.

(21) Appl. No.: 09/234,488

(22) Filed: Jan. 21, 1999

(30) Foreign Application Priority Data

Jan. 22, 1998 (JP) .................................................. 10-010526
Jan. 14, 1999 (JP) .................................................. 11-8126

(51) Int. Cl.[7] ........................................................ C23F 1/02
(52) U.S. Cl. ...................................... 156/345; 118/723 FE
(58) Field of Search ........................ 118/723 E, 723 ER, 118/723 L, 723 LR, 723 MP, 723 FE; 156/345

(56) References Cited

U.S. PATENT DOCUMENTS 6,020,570 * 2/2000 Taki et al. ...................... 219/121.43

* cited by examiner

*Primary Examiner*—Richard Bueker
*Assistant Examiner*—Erin Fieler
(74) *Attorney, Agent, or Firm*—Oliff & Berridge, PLC

(57) ABSTRACT

An object is to make it possible to prevent electron temperature distribution from becoming uneven at surface of a process object when dimensions of the process object are large.

A region division unit 30 encloses the inside of a ring-shaped discharge electrode 15 in the vicinity of that discharge electrode 15, thereby dividing the interior region of a tube-shaped vacuum vessel 11 in a direction perpendicular to the center axis Z thereof into a plasma generation region R1 and a plasma diffusion region R2, This region division unit 30 has a tube-shaped grid 301. This grid 301 has a plurality of electron passing holes and exhibits electrical conductivity. This grid 301, furthermore, is set in place concentrically with the vacuum vessel 11 so as to be positioned on the outside of a substrate W.

19 Claims, 9 Drawing Sheets

PLASMA GENERATION APPARATUS

BACKGROUND OF THE INVENTION

1. Field of the Invention

This invention relates to a plasma generation apparatus for generating a negative ion plasma using low-electron-energy plasma.

2. Description of the Related Art

In recent years there has been extensive use of plasmas in processes for manufacturing various semiconductor devices, liquid crystal displays, and solar cells, etc.

A dry etching process that employs plasma is used for example when subjecting thin films formed on the surfaces of substrates to dry etching. A specific example of such a dry etching process is seen, for instance, in the process of etching a silicon oxide film formed on a silicon semiconductor substrate using the action of active species or ions generated in a plasma.

Film forming processes that use plasmas are also employed in forming requisite thin films on the surfaces of substrates. A specific example of such a film forming process is seen, for instance in the plasma CVD (chemical vapor deposition) process for forming requisite thin films on the surfaces of substrates using a plasma-based vapor-phase reaction. A specific example of such a plasma CVD process would be a process for forming an inter-layer insulating film on a silicon semiconductor substrate.

In other words, in recent years, wiring interconnections have come to be implemented in multiple layers in conjunction with the higher integration of semiconductor devices. As a consequence, it has become necessary to provide insulating films between the wiring layers (inter-layer insulating films). CVD processes can be used in forming these inter-layer films. One such CVD process is the thermal CVD process, which is a process that uses heat as the necessary energy for activating the reaction. Specifically, reactive gas introduced into a process reaction chamber is made to react by the application of heat, thereby forming an inter-layer film.

This thermal CVD process requires a comparatively high temperature, however, which often results in problems in the devices. Recently, therefore, processes have come into use which employ a plasma as the activation energy. An example of a plasma used in such cams is a plasma generated through glow discharges.

Plasma CVD processes are also used in forming requisite thin films on substrates in solar cells.

In the dry etching processes that are typical of plasma processes, however, it is being demanded (1) that the plasma can be generated uniformly at high density in order to cope with larger substrate areas and improved apparatus throughput, (2) that process precision and selectivity can be improved in order to cope with electronic device structure miniaturization and multi-layer implementation, and (3) that uniform plasma can be generated in order to reduce charge-up damage.

In order to answer to these demands, in recent years, various kinds of plasma generation apparatuses (plasma sources) art being developed. Examples of such high-density plasma generation apparatuses are the ECR (electron-cyclotron-resonance) type plasma generation apparatus, the inductively-coupled plasma generation apparatus (ICP generator), the micro-surface wave plasma generation apps, the helicon wave plasma generation apparatus, and the magnetron high-frequency discharge plasma generation apparatus.

Adequate plasma density can be achieved with these apparatuses. When it comes to plasma uniformity, however, as things stand now, adequate uniformity cannot be achieved when $\phi$ is in the 300 mm range.

In these apparatuses, moreover, it is demanded that the plasma electron temperature be kept low in order to suppress excessive dissociation in the process gas.

Nevertheless, high-density plasma generation apparatuses are now being developed for dry etching silicon oxide films. There are serious problems to overcome in these apparatuses, however, namely the accumulation of electrical charges on the substrate surface and the reduction in etching selectivity resulting from excessive dissociation in the gas.

In the etching processes that employ current high-density plasma generation apparatuses, the following problems are being faced.

(1) When forming contact holes by etching a fine silicon oxide film, selectivity for the substrate silicon declines.

(2) When etching gate polysilicon electrodes, abnormal side etching develops due to electric charge accumulation.

(3) Gate oxide film insulation damage occurs.

It is believed that these phenomena occur because of the presence of many high-energy electrons in the plasma generated by low-pressure high-density plasma generation apparatuses. In other words, it is believed that these problems are produced because of the high temperatures of the plasma electrons. That is, when the plasma electron temperature is high, dissociation reactions proceed excessively in the plasma. Consequently, the radical species (CFx radicals, etc.) that are determinative of selectivity become few, or the sheath potential produced at the substrate sure (difference between mean potential in plasma space and substrate surface potential) becomes high. As a result, it is thought, charge accumulation becomes large due to the sheath potential distribution caused by substrate irregularities and the plasma density distribution, whereupon the phenomena noted above arc produced. By sheath potential here is meant the potential at the substrate surface relative to the mean potential in plasma space.

In view of the foregoing, there is a need to develop a method for keeping the electron temperature low in process plasmas. Two methods of achieving this are currently being considered, namely a pulse modulation plasma method and a grid control method.

By pulse modulation plasma method here is meant a method for generating plasmas having low electron temperature by intermittently supplying electric power for plasma generation to a plasma generation electrode. That is, by repeatedly executing and terminating power supply, plasma exhibiting low electron temperature is generated In other words, this is a method for generating a plasma of low electron temperature by subjecting the plasma generation power to a pulse modulation. The pulse signals used in this case are signals having a small pulse width of several tens of micrometers or so.

By employing this method, the electron temperature can be lowered while maintaining the plasma density to some degree. In more specific terms, the speed of plasma density decline when the power supply is terminated is slower than the speed of electron temperature decline. Thus, by repeatedly executing and terminating the power supply, the electron temperature can be lowered while maintaining some degree of plasma density.

This method can be applied to any of the high-density plasma generation apparatuses noted earlier. When that is done, however, the pulse modulation frequency at which optimum electron temperature is obtained differs from apparatus to apparatus. This is due to the differences in rise time and decay time in plasma density and electron temperature between the different apparatuses.

By grid control method is meant a method wherewith a plasma of low electron temperature is generated in a plasma diffusion region by using a grid to divide the region inside the vacuum vessel between a plasma generation region and a plasma diffusion region.

FIG. 17 is a diagram representing the configuration of a conventional plasma generation apparatus wherein the grid control method is adopted as the method of reducing electron temperature. This figure diagrams a representative case wherein the grid control method is applied to a magnetron high-frequency discharge plasma generation apparatus. In the figure, an example configuration is diagrammed for a substrate surface processing apparatus having such a plasma generation apparatus. In the figure, moreover, in the interest of diagrammatic clarity, hatching is used to indicate cross-sections only for some configurational elements.

In the apparatus diagrammed in the figure, a flat plate-shaped grid 42 is placed so that it lies perpendicular to the center axis Z of a vacuum vessel 41, thereby dividing the region inside the vacuum vessel 41, in the center axis Z direction, between a plasma generation region R1 and a plasma diffusion region R2, In other words, the diagrammed plasma generation apparatus is made so that, by placing the plate-form grid 42 so that it lies parallel with a substrate W, the region inside the vacuum vessel 41 is divided, in the center axis Z dimension, between the plasma generation region R1 and the plasma diffusion region P2.

However, when the discharge power becomes large in a plasma generation apparatus that uses the pulse modulation plasma method as the method for reducing the electron temperature, it becomes difficult to obtain low electron temperatures, which is a problem. This is so because, when the discharge power is great, it becomes difficult for the electron temperature to decline when the power supply is stopped.

With this apparatus, moreover, if the power supply stop time is lengthened in order to obtain plasma of low electron temperature, plasma generation efficiency declines, and substrate processing efficiency also declines. These are problems too.

These problems do not arise, however, with a plasma generation apparatus that employs the grid control method as the method of lowering the electron temperature. This is so because, with such an apparatus, nothing at all is done to the discharge power.

Nevertheless, there is also a problem with this apparatus in that, when the substrate dimension become large, the electron temperature distribution at the substrate surface sometimes becomes uneven.

More specifically, in this apparatus, the grid 42 is placed so that it is parallel to the substrate W. Thus, when the dimensions of the substrate W become large, the caliber of the grid 42 also becomes large. As a result, the grid 42 sometimes suffers deformation when heated by the plasma. When the grid 42 becomes deformed, the parallelism between the grid 42 and the substrate W collapses. When this happens, the electron temperature distribution at the surface of the substrate W becomes uneven.

Thereupon, an object of the present invention is to provide a plasma generation apparatus wherewith the electron temperature distribution at the surface of the process object can be prevented from becoming uneven even when the dimensions of that process object are large.

In order to resolve the problems noted in the foregoing, the plasma generation apparatus cited in claim 1 comprises: a tubes vacuum vessel, gas induction means, atmosphere exhausting means, a ring-shaped discharge electrode, discharge electrode power supply means, region division means, and electron temperature control means.

Here, the gas induction means functions to introduce discharge gas into the interior of the vacuum vessel The atmosphere exhausting means functions to exhaust the atmosphere in the interior of the vacuum vessel. The discharge electrode is provided concentrically with the vacuum vessel, and functions to generate plasma in the peripheral region of the vacuum vessel by causing the discharge gas to discharge. The discharge electrode power supply means fictions to supply electrical discharge power to the discharge electrode for causing the discharge gas to discharge.

The region division means covers the inside of the discharge electrode near the discharge electrode, thereby dividing the region inside the vacuum vessel, in a direction perpendicular to the center axis thereof, into a plasma generation region and a plasma diffusion region. These region division means comprises a tube-shaped wall having a plurality of electron passing holes therein. This wall is placed concentrically with the vacuum vessel so that it is positioned outside the position wherein the process object is placed. The electron temperature control means functions to control the electron temperature of the plasma in the plasma diffusion region.

As based on the apparatus cited in claim 1, the interior regions of the vacuum vessel can be divided into a plasma generation region and a plasma diffusion region in a direction perpendicular to the center axis of the vacuum vessel. Thus the strength of the wall can be prevented from declining even when the dimensions of the process object are large. As a result, it is possible to prevent the electron temperature distribution at the surface of the process object from becoming uneven due to deformation of the wall.

As based on this apparatus, moreover, the interior regions of the vacuum vessel can be divided between a plasma generation region and a plasma diffusion region, Thus it is possible to control the plasma in the plasma diffusion region without affecting the plasma in the plasma generation region. As a result, it is possible to enhance the controllability of the plasma in the plasma diffusion region.

As based on this apparatus, furthermore, the region division means are placed near the discharge electrode. This makes it possible to effectively control the electron temperature in the plasma in the plasma diffusion region.

As based on this apparatus, moreover, the region division means are positioned outside the process object. Thus the plasma density can be made uniform over the entire surface of the process object. As a result, plasma processing can be performed uniformly over the entire surface of the process object.

The plasma generation apparatus cited in claim 2 is the apparatus cited in claim 1, wherein, the wall exhibits electrical conductivity As based on the apparatus cited in claim 2, region division is accomplished using the wall that exhibits electrical conductivity. Thus the electron temperature of the plasma in the plasma diffusion region can be made lower than the electron temperature in the plasma generation region.

The plasma generation apparatus cited in claim 3 is the apparatus cited in claim 2, wherein the electron temperature control means comprises insulation means. This insulation means functions to electrically insulate the wall from a reference potential point.

As based on the apparatus cited in claim 3, the wall can be electrically insulated from a reference potential point. Thus it is possible to control the electrical characteristics of the wall. As a result, using this wall, it is possible to control the electron temperature of the plasma in the plasma diffusion region.

The plasma generation apparatus cited in claim 4 is the apparatus cited in claim 3, wherein the electron temperature control means comprises a capacitive element. This capacitive element is inserted between the wall and the reference potential point.

As based on the apparatus cited in claim 4, the high-frequency impedance of the wall can be made small, when that is the case, it is possible to suppress fluctuations in the wall potential, even when the potential in the plasma space fluctuates due to the application of high-frequency electric power to the discharge electrode. As a consequence, the sheath potential generated at the surface of the wall can be set to a desired potential. Thus it becomes possible to lower the electron temperature of the plasma in the plasma diffusion region to a rather low temperature.

The plasma generation apparatus cited in claim 5 is the apparatus cited in claim 3, the electron temperature control means comprises potential control means. This potential control means functions to control the potential of the wall As based on the apparatus cited in claim 5, the potential of the wall can be controlled. Thus the sheath potential generated at the surface of the wall can also be controlled. As a result, the electron temperature of the plasma in the plasma diffusion region can also be controlled.

The plasma generation apparatus cited in claim 6 is the apparatus cited in claim 3, the electron temperature control means comprises potential control leans and a capacitive element. The potential control means functions to control the wall potential. The capacitive element is inserted between the wall and a reference potential point.

As based on the apparatus cited in claim 6, the electron temperature of the plasma in the plasma diffusion region can be lowered to a rather low temperature, and this electron temperature can be controlled over a wide range.

The plasma generation apparatus cited in either claim 7 or claim 8 is the apparatus cited in either claim 4 or claim 6, wherein the capacitive element is a variable capacitive element.

As based on this plasma generation apparatus cited in either claim 7 or claim 8, the capacitance of the capacitive element can be controlled. Thus the high-frequency impedance of the wall can also be controlled. As a consequence, the sheath potential generated at the surface of the wall can also be controlled. Thus the electron temperature of the plasma in the plasma diffusion region can also be controlled.

The plasma generation apparatus cited in either claim 9 or claim 10 is the apparatus cited in either claim 5 or claim 6, wherein the potential control means controls the DC potential on the wall.

As based on the apparatus cited in either claim 9 or claim 10, the electron temperature of the plasma in the plasma diffusion region can be continuously controlled over a broad range.

The plasma generation apparatus cited in claim 11 is the apparatus cited in claim 1, wherein the electron temperature control means comprises area adjustment means. This area adjustment means functions to adjust the total area of the plurality of electron passing holes.

As based on the plasma generation apparatus cited in claim 11, the total area of the plurality of electron passing holes can be adjusted. Thus the sheath potential generated in the electron passing holes can also be controlled. As a consequence, the electron temperature of the plasma in the plasma diffusion region can also be controlled.

This area adjustment means may be, for example, means that adjusts the total area of the plurality of electron passing holes by adjusting the area of each electron passing hole, or this may be such as to adjust the total area by adjusting the number of electron passing holes.

The plasma generation apparatus cited in claim 12 is the apparatus cited in claim 1, wherein the wall is divided so that it comprises a plurality of small walls, and the electron temperature control means comprises interval control means capable of adjusting the intervals between the plurality of small walls.

As based on the apparatus cited in claim 12, the intervals between the plurality of small walls can be adjusted. Thus the potential barrier generated between the plurality of small walls can be controlled. As a consequence, the breadth of the electron energy distribution in the plasma diffusion region can also be controlled. Hence there is no need to bias the wall. As a result, in processes wherein reaction gasses are employed, the electron temperature of the plasma in the plasma diffusion region can be controlled even when an insulating film is formed on the surface of the wall.

The plasma generation apparatus cited in claim 13 is the apparatus cited in claim 1, wherein the temperature control means comprises interval adjustment means. This interval adjustment means can adjust the interval between the wall and the discharge electrode.

As based on the apparatus cited in claim 13, the interval between the wall and the discharge electrode can be adjusted. Thus the sheath potential generated at the surface of the wall can be controlled. As a consequence, the potential barrier formed by the wall can be controlled also. Thus the energy possessed by the electrons which can cross over this potential barrier varies. As a result, the electron temperature of the plasma in the plasma diffusion region can be controlled.

As based on this apparatus, moreover, plasma generation efficiency can be prevented from declining arid the apparatus can be prevented from becoming large. More specifically, when the interval between the wall and the discharge electrode becomes too small, discharges are generated between the wall and the discharge electrode. This causes plasma generation efficiency to decline. Conversely, when that interval is too large, the apparatus becomes larger. Hence it is evident that, by being, able to adjust the interval between the wall and the discharge electrode, plasma generation efficiency can be prevented from declining and the apparatus can be prevented from becoming large.

The plasma generation apparatus cited in claim 14 is the apparatus cited in claim 1, wherein the interval between the wall and the discharge electrode is set to an interval wherewith no abnormal discharge will be generated between the two.

As based on the apparatus cited in claim 14, abnormal discharges can be prevented from being generated between the wall and the discharge electrode. Hence plasma generation efficiency can be enhanced.

The plasma generation apparatus cited in claim 15 is the apparatus cited in claim 1, wherein the wall is placed so as to be parallel to the center axis of the vacuum vessel.

As based on the apparatus cited in claim 14, the wall can be formed easily. The plasma generation apparatus cited in claim 16 is the apparatus cited in claim 1 wherein the wall is tilted relative to the center axis of the vacuum vessel so that it can be oriented toward the process object.

As based on the apparatus cited in claim 16, the plasma density at the surface of the process object can be raised. Hence the process object processing efficiency can be enhanced.

The plasma generation apparatus cited in claim 17 is the apparatus cited in claim 1, wherein the wall is covered by a dielectric.

As based on the apparatus cited in claim 17, it is possible to prevent metallic impurities from coming out from the surface of the wall due to the interaction between the wall and plasma.

The plasma generation apparatus cited in claim 18 is the apparatus cited in claim 1, wherein the region division means comprises a first and a second ring-shaped partition panel. The outer edge of the first partition panel is fixed to the inner wall side of the vacuum vessel. To the inner edge of this partition panel is fixed one end of the wall. The second partition panel is deployed so that, together with the first partition panel, it sandwiches the discharge electrode. The outer edge of this partition panel is fixed to the inner wall side of the vacuum vessel. To the inner edge of this partition panel is fixed the other end of the wall.

As based on the apparatus cited in claim 18, it is easy to configure the region division means that covers the discharge electrode from the inside thereof The plasma generation apparatus cited in claim 19 is the apparatus cited in claim 1, wherein a plurality of electron passing holes are arrayed in a lattice pattern.

As based on the apparatus cited in claim 19, it is easy to configure the wall having electron passing holes.

Figure 12:
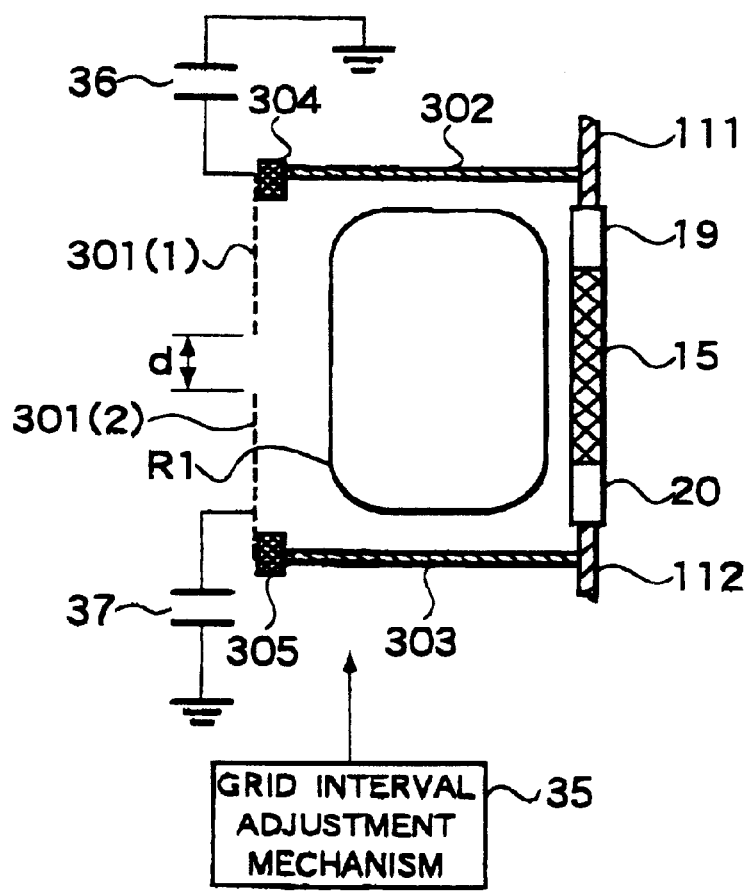
Figure 13:
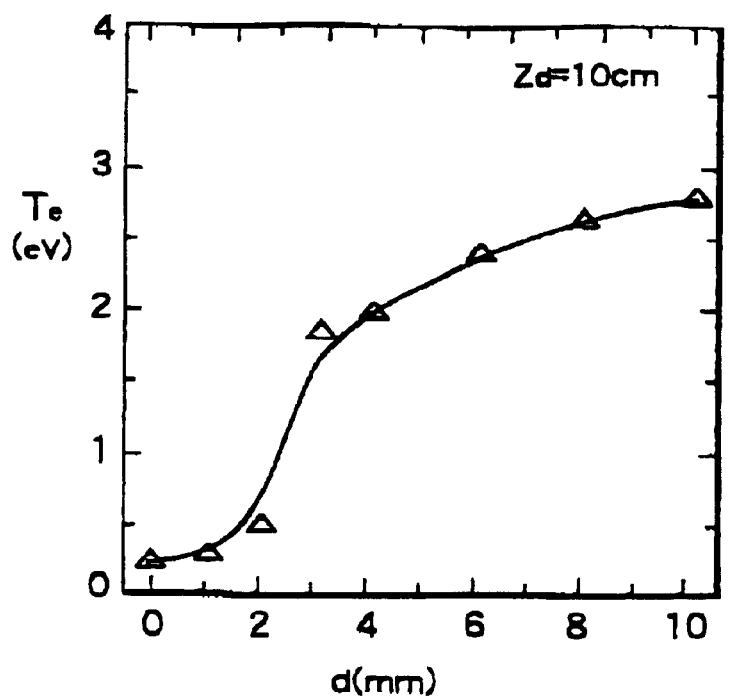
Figure 14:
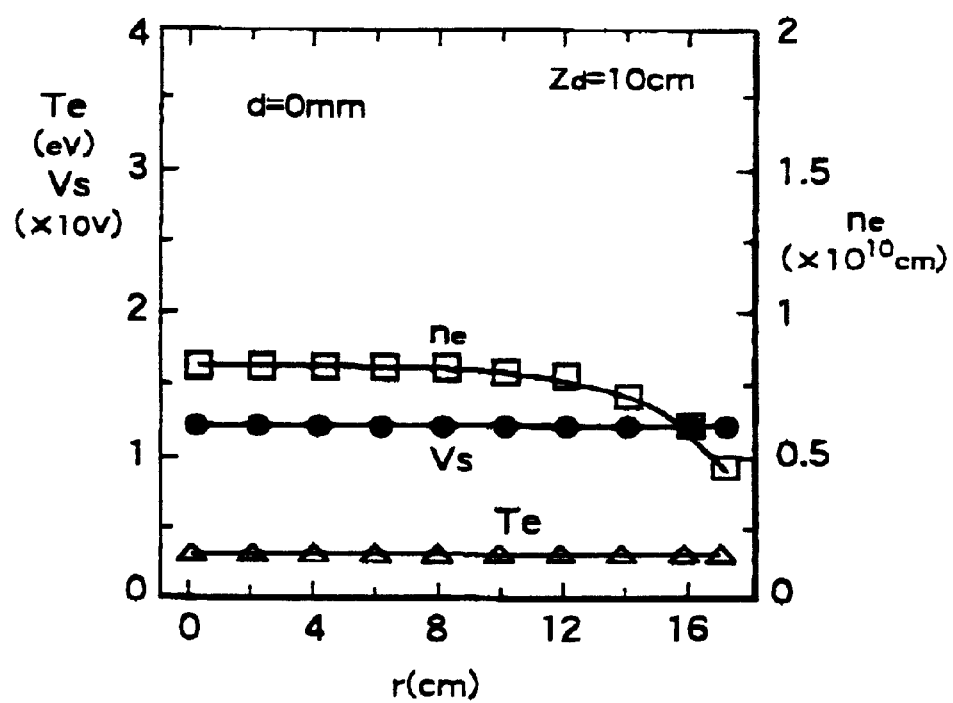
Figure 15:
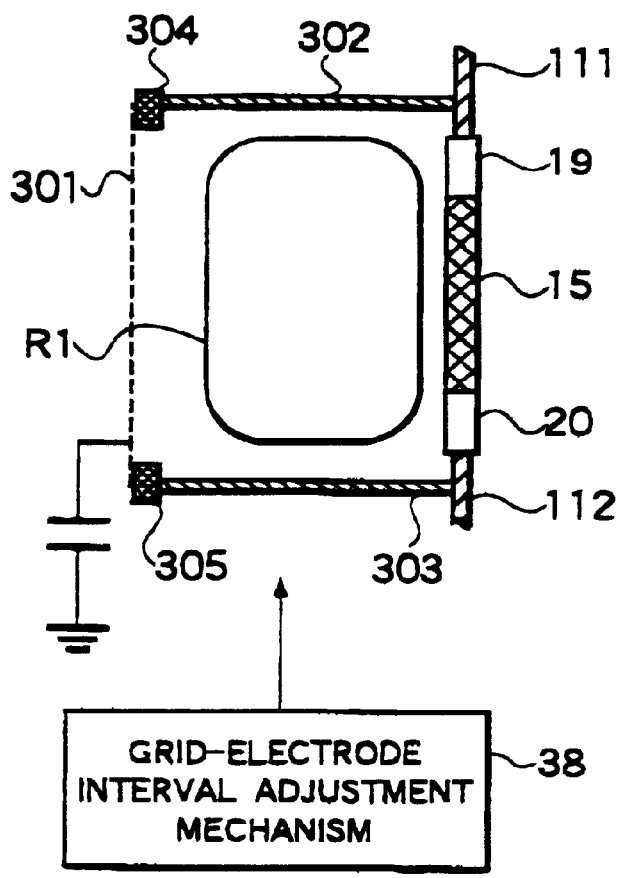
Figure 16:
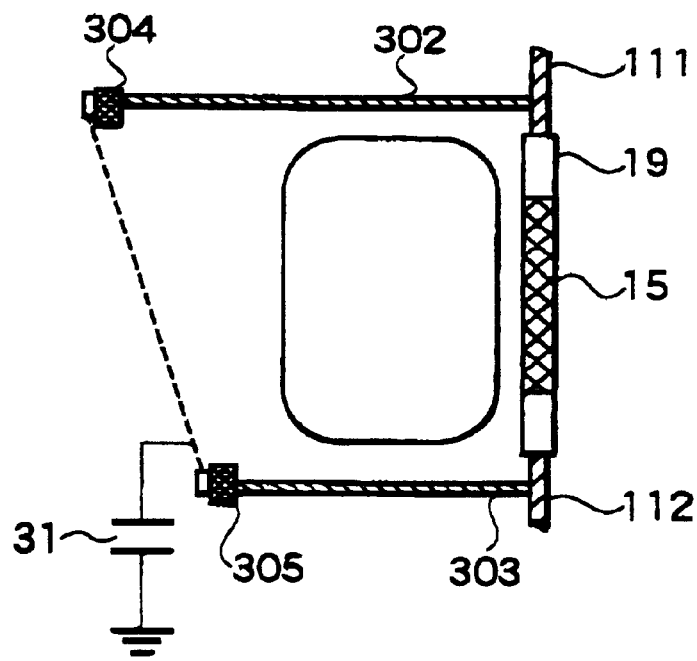
Figure 17:
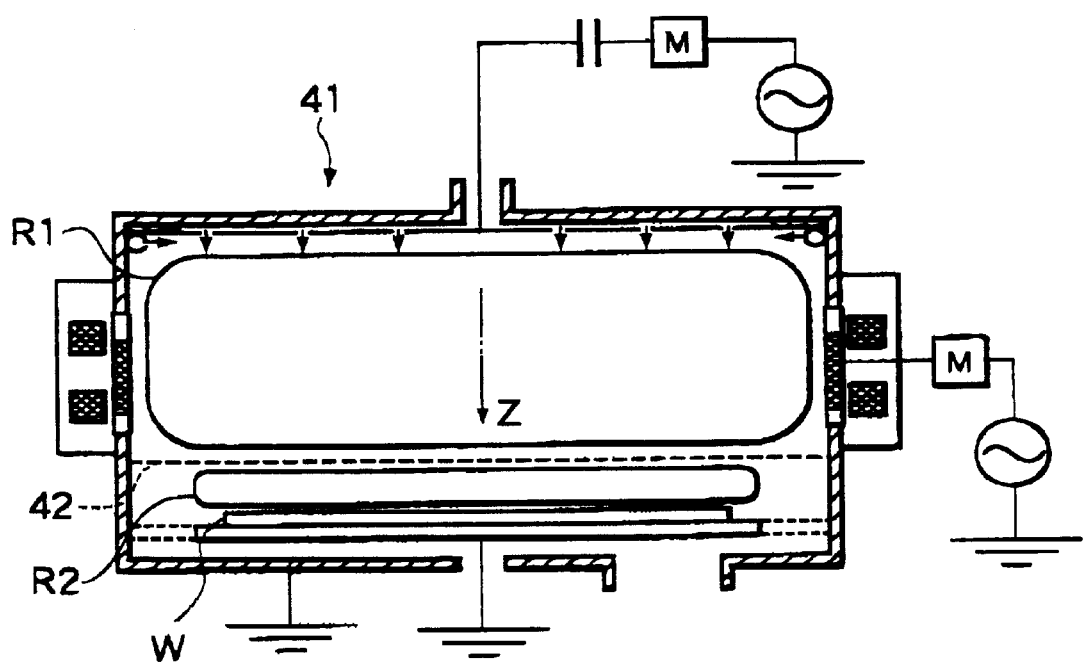

Fig, 11 is a characteristic lot for describing the effectiveness of the seventh embodiment;

FIG. 12 is a cross-sectional diagram depicting the main components in an eighth embodiment;

FIG. 13 is a characteristic plot for describing the effectiveness of the eighth embodiment;

FIG. 14 is a characteristic plot for describing the effectiveness of the eighth embodiment, FIG. 15 is a cross-sectional diagram depicting the main components in a ninth embodiment;

FIG. 16 is a cross-sectional diagram depicting the main components in a tenth embodiment, FIG. 17 is a cross-sectional diagram depicting the configuration of a conventional plasma generation apparatus.

DESCRIPTION OF THE PREFERRED EMBODIMENTS

Embodiments of the present invention are now described with reference to the drawings.

First Embodiment

Configuration

Figure 1:
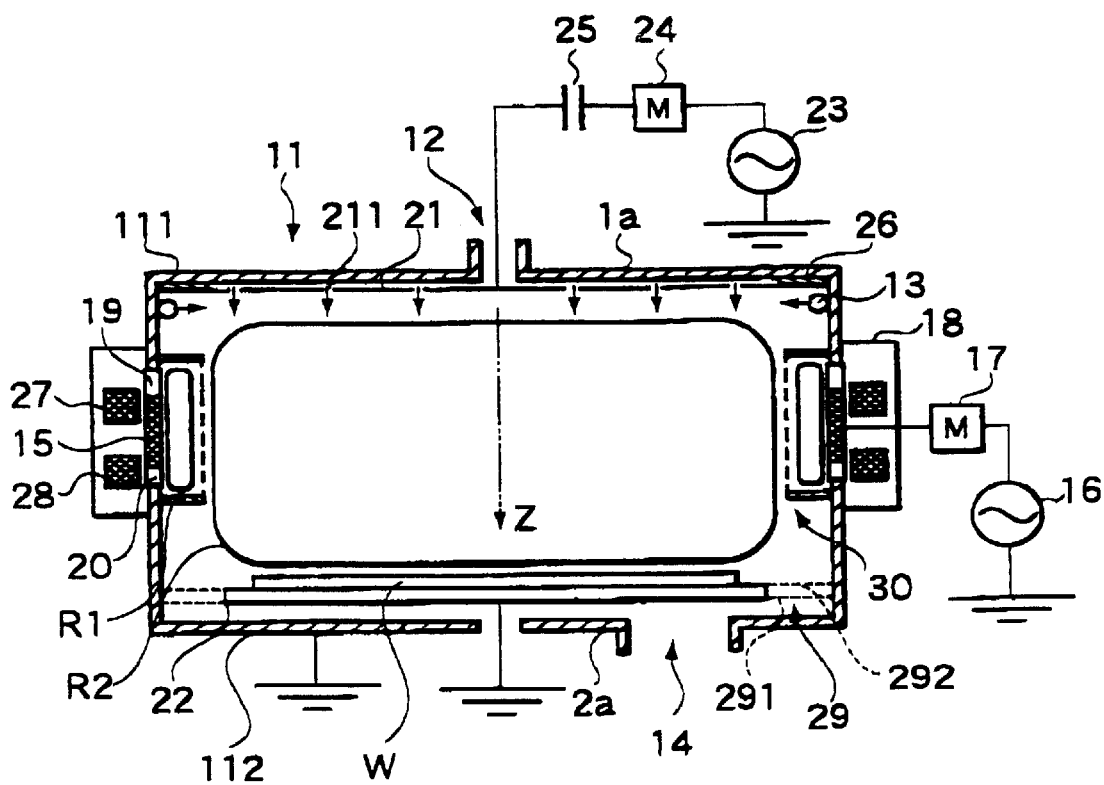
FIG. 1 is a cross-sectional diagram depicting the overall configuration of a first embodiment.

FIG. 1 is a lateral cross-sectional diagram depicting the configuration of a first embodiment of the present invention. The diagram in FIG. 1 represents a case wherein the present invention is employed in a magnetron high-frequency discharge plasma generation apparatus. The figure also represents a case wherein the present invention is employed in a plasma generation apparatus in a substrate surface processing apparatus. In the figure, moreover, in the interest of diagrammatic clarity, hatching is used to indicate cross-sections only for some configurational elements.

The substrate surface processing apparatus diagrammed comprises, for example, a cylindrical vacuum vessel 11, a gas induction unit 12, a gas induction pipe 13, and an atmosphere exhaust unit 14. Here, the vacuum vessel 11 functions to form a plasma generation space. The gas induction unit 12 and gas induction pipe 13 functions to introduce discharge gas into the interior of the vacuum vessel 11. The atmosphere exhaust unit 14 functions to exhaust atmosphere from the interior of the vacuum vessel 11.

This apparatus, moreover, comprises for example, a cylindrical discharge electrode 15, a high-frequency oscillator 16, a matching circuit 17, a circular ring-shaped shielding cover 18, and circular ring-shaped insulators 19 and 20. Here, the discharge electrode 15 functions to form a high-frequency electric field for magnetron discharges. The high-frequency oscillator 16 functions to generate high-frequency electric power for the discharges and to supply that power to the discharge electrode 15. The matching circuit 17 functions to match the high-frequency oscillator 16 with the discharge electrode 15. The shielding cover 18 functions to shield the high-frequency electric field formed by the discharge electrode 15. And the insulators 19 and 20 function to effect insulation between the vacuum vessel 11 and the discharge electrode 15.

This apparatus also comprises a disk-shaped upper electrode 21, a disk-shaped lower electrode 22, a high-frequency oscillator 23, a matching circuit 24, a DC blocking capacitor 25, and an insulator 26. Here the upper electrode 21 and lower electrode 22 form parallel flat electrodes. The matching circuit 24 functions to match the high-frequency oscillator 23 with the upper electrode 21. The DC blocking capacitor 25 functions to block the supply of DC current to the upper electrode 21. And the insulator 26 functions to effect insulation between the upper electrode 21 and the vacuum vessel This apparatus further comprises two circular ring-shaped permanent magnets 27 and 28, and a circular ring-shaped electric field shielding unit 29. Here the permanent magnets 27 and 28 function to form a magnetic field in the interior of the vacuum vessel 11. The electric field shielding unit 29 functions to shield the high-frequency electric field formed in the interior of the vacuum vessel 11.

This apparatus also comprises a region division unit 30. This region division unit 30 functions to divide the interior region of the vacuum vessel 11, in the radial direction (direction perpendicular to the center axis Z of the vacuum vessel 11) thereof, into a plasma generation region R1 and a plasma diffusion region R2.

The cylindrical vacuum vessel 11 described above is positioned, for example, so that the center axis Z thereof is oriented in the vertical direction. This vacuum vessel 11 is also divided in the horizontal so that it comprises an upper vessel 111 and a lower vessel 112. The upper vessel 111 is closed at its upper end and opened at its lower end. Conversely, the lower vessel 112 is opened at its upper end and closed at its lower end.

Between the upper vessel 111 and the lower vessel 112 is positioned the ring-shaped discharge electrode 15. This discharge electrode 15, in this case, is set in place concentrically with the vacuum vessel 11. The upper vessel 111 and the discharge electrode 15 are insulated by the insulator 19. Similarly, the lower vessel 112 and the discharge electrode 15 are insulated by the insulator 20. The lower vessel 112 is also grounded. The upper vessel 11 is grounded through the shielding cover 18 and the lower vessel 112.

The gas induction unit 12 is provided on a top plate 1a of the upper vessel 111. The atmosphere exhaust unit 14 is provided on a bottom plate 2a of the lower vessel 112.

The disk-shaped electrodes 21 and 22 are positioned so that they are mutually parallel and in opposition. They are also positioned in the horizontal. In other words, they are positioned perpendicular to the center axis Z of the vacuum vessel 11. The upper electrode 21 is insulated from the upper vessel 111 by the insulator 26. The shielding cover 18 is attached to the vacuum vessel 11 so that it covers the discharge electrode 15 and the permanent magnets 27 and 28 from the outside.

The ring-shaped permanent magnets 27 and 28 are set in place concentrically with the vacuum vessel 11. They are positioned so as to enclose the discharge electrode 15. They are also positioned so as to be separated by a prescribed interval in the center axis Z direction. In this case, the permanent magnet 27 is positioned toward the upper end of the discharge electrode I 5, while, conversely, the permanent magnet 28 is positioned toward the lower end thereof The permanent magnets 27 and 28 are magnetized in the radial direction. In this case, these permanent magnets are magnetized in mutually opposite directions. In other words, if we assume for a moment that the permanent magnet 27 is magnetized so that its inner part is the N pole and its outer part is the S pole, then the permanent magnet 28 is magnetized so that its inner part is the S pole and its outer part is the N pole. Therefore, lines of magnetic force are formed which extend from the inside part of the permanent magnet 27 toward the center axis Z of the vacuum vessel 11, and then return to the inside part of the permanent magnet 28. These lines of magnetic force have portions that are roughly parallel with the center axis Z of the vacuum vessel 11. The length of these portions becomes longer the closer the lines approach the center axis Z. In this case, the lines of magnetic force, in theory, are bent back on the center axis Z of the vacuum vessel 11, even at maximum, by the interaction of the lines of magnetic force output from the parts of the permanent magnet 27.

The ring-shaped electric field shielding unit 29 is set in place concentrically with the vacuum vessel 11. In this case, the electric field shielding unit 29 is inserted between the peripheral edge of the lower electrode 22 and the side wall of the lower vessel 112. The electric field shielding unit 29, moreover, comprises two ring-shaped metal shielding plates 291 and 292. These two metal shielding plates 291 and 292 are set in place in parallel so that they are separated by a prescribed interval in the center axis Z direction of the vacuum vessel 11.

In the metal shielding plates 291 and 292 are formed exhaust holes for exhausting the atmosphere in the interior of the vacuum vessel 11. In this case, the exhaust holes formed in the metal shielding plate 291 and the exhaust holes formed in the metal shielding plate 292 are positioned so that they do not overlap on the whole. They are formed, in other words, so that either part of it overlaps or so that it doesn't overlap completely. Thus both a high-frequency electric field shielding function and an atmosphere exhaust function are achieved, The cylindrical region division unit 30 is set in place concentrically with the vacuum vessel 11, This region division unit 30 is also positioned so that, in the vicinity of the discharge electrode 15, it covers the inside of the discharge electrode 15. Thus the region inside the vacuum vessel 11 is divided, in a direction perpendicular to the center axis Z, into a plasma generation region R1 and a plasma diffusion region R2.

Figure 2:
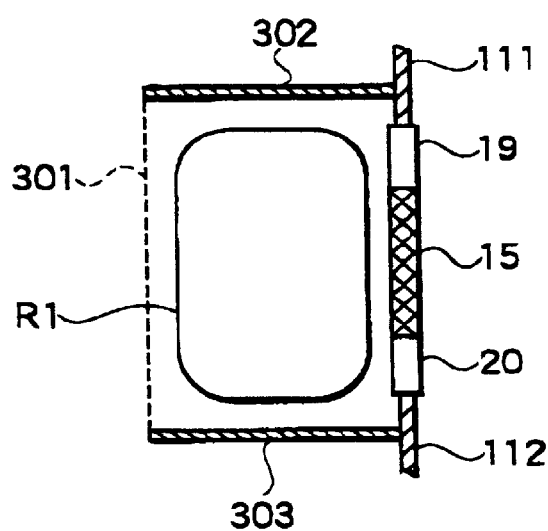
FIG. 2 is a cross-sectional diagram depicting the main components in the first embodiment.

FIG. 2 is a lateral cross-sectional diagram that gives an enlarged view of this region division unit 30. As diagrammed therein, the region division unit 30 comprises a cylindrical grid 301, and two circular ring-shaped partition panels 302 and 303.

The cylindrical grid 301 is set in place concentrically with the vacuum vessel 11 Thus this grid 301 is positioned parallel to the center axis Z of the vacuum vessel 11. This grid 301 is also positioned so that it is in opposition to the discharge electrode 15. This grid 301, furthermore, is fixed in the vacuum vessel 11 via the ring-shaped partition panels 302 and 303.

In this case, the partition panels 302 and 303 are set in place concentrically with the vacuum vessel 11. The partition panels 302 and 303 are also positioned in parallel. The outer edge of the partition panel 302 is fixed to the side wall of the upper vessel 111, while to the inner edge thereof is fixed the upper end of the grid 301. The outer edge of the partition panel 303, meanwhile, is fixed to the side wall of the lower vessel 112, while to the inner edge thereof is fixed the lower end of the grid 301. The partition panels 302 and 303 are configured so that the interval between the grid 301 and the discharge electrode 15 is made such that no abnormal discharges occur between the two, The grid 301 and the partition panels 302 and 303 are formed of a metal, for example. Thus these members exhibit electrical conductivity Stainless steel, for example, may be used as this metal. In this case, the grid 301 and partition panels 302 and 303 may be formed completely of metal, or they may be formed so that only their surfaces are metal The surfaces of the grid 301 and the partition panels 302 and 303 are coated with a dielectric that can withstand the plasma. In other words, they are coated with a dielectric that does not readily react with the plasma. Such dielectrics include $Al_2O_3$, ceramics and so on, for example.

Operation

The operation, in the configuration described above, is now described,

A description is given first of the operation in a case where plasma is generated and that plasma is used in performing a prescribed treatment on the surface of a substrate W.

In this case, the substrate W, as diagrammed in FIG. 1, is placed on the upper surface of the lower electrode 22. In this case, moreover, discharge gas is introduced into the interior of the vacuum vessel 11 from the gas induction unit 12. This discharge gas diffuses uniformly inside the vacuum vessel 11 through gas diffusion holes 211 formed in the upper electrode 21. In this case, furthermore, the discharge gas is introduced into the interior of the vacuum vessel 11 via the gas induction pipe 13. In this case, moreover, the atmosphere present inside the vacuum vessel 11 is exhausted via the atmosphere exhaust unit 14. In this manner a reduced pressure condition is established in the interior of the vacuum vessel 11.

In this case, high-frequency electric power is supplied to the discharge electrode 15 from the high-frequency oscillator 16 via the matching circuit 17. The frequency of this high-frequency electric power is set, for example, at 13.56 MH, and the power is set, for example, at 500 W. In this case, furthermore, high-frequency electric power is supplied to the upper electrode 21 from the high-frequency oscillator 23 via the matching circuit 24 and the DC blocking capacitor 25. The frequency of this high-frequency power is set, for example, at 100 Mz, and the power is set, for example, at When high-frequency power is supplied to the discharge electrode 15, the potential on the discharge electrode 21 fluctuates. This causes a high-frequency electric field to be formed in the interior of the vacuum vessel 11. This high-frequency electric field interacts with the magnetic field formed by the permanent magnets 27 and 28, causing a plasma to be generated inside the vacuum vessel 11.

More specifically, the high-frequency electric field formed by the discharge electrode 15 is oriented in the direction of the center axis Z of the vacuum vessel 11. The lines of magnetic force formed by the permanent magnets 27 and 28, meanwhile, have segments that are roughly parallel to the center axis Z of the vacuum vessel 11 Thus a high-frequency electric field and magnetic field that are roughly perpendicular are formed in the interior of the vacuum vessel 11. As a consequence, electrons are trapped by the lines of magnetic force in the vicinity of the discharge electrode 15, and a magnetron motion ensues. Electrons are accelerated by this magnetron motion, and the discharge gas is ionized. A plasma is generated inside the vacuum vessel 11 by the magnetron discharges. This plasma is hereinafter called the first plasma.

Meanwhile the potential on the upper electrode 21 fluctuates due to the high-frequency electric power supplied to the upper electrode 21. This causes a high-frequency electric field to be formed in the interior of the vacuum vessel 11, oriented in the direction of the center axis Z of the vacuum vessel 11. This high-frequency electric field interacts with the magnetic field formed by the permanent magnets 27 and 28 to form a plasma inside the vacuum vessel 11.

More specifically, when this high-frequency electric field is formed, the high-energy electrons trapped in the lines of magnetic force formed by the permanent magnets 27 and 28 exhibit high-frequency oscillation on the lines of magnetic force in the direction of the center axis Z of the vacuum vessel 11. The high-energy electrons are heated by this high-frequency oscillation. This heating causes the discharge gas to discharge. A plasma is generated by this high-frequency oscillation discharges. This plasma is hereinafter called the second plasma.

The formation of the first and second plasmas described above activates surface treatment chemical reactions. Thus the requisite treatment is administered to the surface of the substrate W.

The density of the first plasma rises as the distance from the center axis Z of the vacuum vessel 11 increases. In other words, that density rises as the side surface inside the discharge electrode 15 is approached. This is because of the fact that the electric field formed by the discharge electrode 15 and the magnetic field formed by the permanent magnets 27 and 28 become stronger as the inner surface of the discharge electrode 15 is approached. The reason, in other words, is that magnetron discharges become more vigorous as these fields become stronger.

The density of the second plasma rises as the center axis Z of the vacuum vessel 11 is approached. This is because of the fact that the lengths of the portions of the lines of magnetic force formed by the permanent magnets 26 and 27 that are roughly parallel to the center axis Z become longer as the center axis Z is approached. The reason, in other words, is that, due to the lengths of the parallel segments becoming longer, the distance over which the high-energy electrons can be accelerated in the direction of the center axis Z of the vacuum vessel 11 becomes longer.

The density of the first plasma is dependent on the size of the high-frequency electric power output by the high-frequency oscillator 16. Accordingly, by controlling the size of this high-frequency power, the density of the first plasma can be controlled. Similarly, the density of the second plasma is dependent on the size of the high-frequency electric power output by the high-frequency oscillator 23. Accordingly, the density of the second plasma can be controlled by controlling the size of that high-frequency power.

Thus, by controlling the sizes of the two high-frequency electric powers, the plasma density distribution in the radial direction of the vacuum vessel 11 can be controlled. As a consequence, even when the gas pressure is low, a plasma can be generated that exhibits high density overall, and uniform density distribution, across the interior of the vacuum vessel 11, from the periphery thereof to the center thereof.

The operation as described above applies to the case where a plasma is generated and that plasma is used to subject the surface of the substrate W to a prescribed treatment.

Next is described the operation in a case where the electron temperature of the plasma is lowered in the plasma diffusion region R2.

The region division unit 30 is configured so as to enclose the discharge electrode 15 from the inside, in the vicinity of the discharge electrode 15. Thus the region in the region inside the vacuum vessel 11 wherein the first plasma is most generated is enclosed by the region division unit 30. The grid 301 of this region division unit 30 is connected directly to the partition panels 302 and 303. Thus the potential on the grid 301 is set to the same potential as that of the partition panels 302 and 303. The partition panel 302 is grounded through the vessels 111 and 112 and the shielding cover 18. The partition panel 303 is grounded through the lower vessel 112. Thus the potential on the partition panels 302 and 303, and on the grid 301, is set to zero potential.

In a process plasma, the temperature of the electrons is far higher than the temperature of the ions, while the mass of the electrons is far smaller than the mass of the ions. Therefore, in such a plasma, the mobility of the electrons becomes considerably greater than the mobility of the ions. As a consequence, when a plasma is generated in the plasma generation region R1, the electrons move more quickly than the ions toward the wall of the region division unit 30. Because of this, more ions are left remaining in the plasma than electrons. As a result, the potential in the plasma (plasma space potential) becomes higher than the potential on the wall of the region division unit 30. Because of this, the wall potential (sheath potential) relative to the plasma space potential becomes large in the negative direction. As a consequence, electrons dispersed out from the plasma toward the wall are repelled, while ions dispersed out from the plasma toward the wall are accelerated.

When the wall of the region division unit 30 is configured by a grid 301 made of metal, low-energy electrons are repelled by the sheath potential generated at the surface of the grid 301. High-energy electrons, on the other hand, overcome this sheath potential and move through the electron passing holes in the grid 301 to the plasma diffusion region R2.

The high-energy electrons that move to the plasma diffusion region R2 are accelerated in this region R2, and repeatedly collide with neutral gas molecules. As a consequence of these collisions, the high-energy electrons loose their energy and become low-energy electrons. And by these collisions, new discharge occurs. As a result, plasma exhibiting a low electron temperature is generated in the plasma diffusion region R2.

In the foregoing is described the operation of lowering the electron temperature of the plasma in the plasma diffusion region R2.

Effect

As based on the embodiment described in the foregoing, the following effect can be realized.

(1) Firstly, as based on this embodiment, the region inside the vacuum vessel 11 can be divided between a plasma generation region R1 and a plasma diffusion region R2 in a direction perpendicular to the center axis Z thereof. Because of this, when the dimensions of the substrate W become large, the strength of the grid 301 can be prevented from declining. As a consequence, in cases like this, it is possible to prevent the electron temperature distribution at the surface of the substrate W from becoming uneven due to deformation of the grid 301.

(2) Also, by dividing the region inside the vacuum vessel 11 between a plasma generation region R1 and a plasma diffusion region R2, the plasma in the plasma diffusion region R2 can be controlled without affecting the plasma in the plasma generation region R1. Because of this, the controllability of the plasma in the plasma diffusion region R2 can be enhanced.

(3) As based on this embodiment, furthermore, region division is accomplished using a grid 301 that exhibits electrical conductivity. Because of this, the electron temperature of the plasma in the plasma diffusion region R2 can be made lower than the electron temperature of the plasma in the plasma generation region R1.

(4) In addition, by performing region division with the grid 301 exhibiting electrical conductivity, it becomes possible to facilitate control of the electron temperature of the plasma in the plasma diffusion region R2.

(5) As based on this embodiment, furthermore, the surface of the metallic grid 301 is coated with a dielectric that can withstand the plasma. Because of this, it is possible to prevent the substrate W from being contaminated by metallic impurities coming from the surface of the grid 301

More specifically, when the surface of the grid 301 is not coated with a dielectric, the interaction between the grid 301 and the plasma causes metallic impurities to enter the plasma space from the surface of the grid 301. As a result, the substrate W is contaminated. When this is countered by coating the surface of the grid 301 with a dielectric that can withstand the plasma, the grid 301 and the plasma can be prevented from interacting. Thus it is possible to prevent the substrate W from being contaminated by the release of metallic impurities from the surface of the grid 301.

(6) As based on this embodiment, moreover, the region division unit 30 is formed by a grid 301 and by ring-shaped partition panels 302 and 303. Because of this, not only can the discharge electrode 15 be definitely covered, but the region division unit 30 can be easily configured.

(7) As based on this embodiment, furthermore, a wall having electron passing holes is formed by the grid 301. Hence this wall can be easily configured.

(8) As based on this embodiment, moreover, the grid 301 is positioned so that it is parallel to the center axis Z of the vacuum vessel 11. Hence the grid 301 can be easily configured.

(9) As based on this embodiment, moreover, the interval between the discharge electrode 15 and the grid 301 is set to an interval whew no abnormal discharge is generated between the two. Because of this, it is possible to enhance plasma generation efficiency in the plasma generation region R1.

Modifications are now described.

In the descriptions in the foregoing, the grid 301 and the partition panels 302 and 303 are formed of a metal. In this embodiment, however, these may be formed of some electrically conductive material other than a metal. In this embodiment, moreover, no bias is applied to the grid 301, wherefore these may be formed of a material other than an electrically conductive material For example, at any process, dielectric is formed on the surface of the grid 301 naturally. In this case, it is needs to make grid 301 of insulating material.

Second Embodiment

Figure 3:
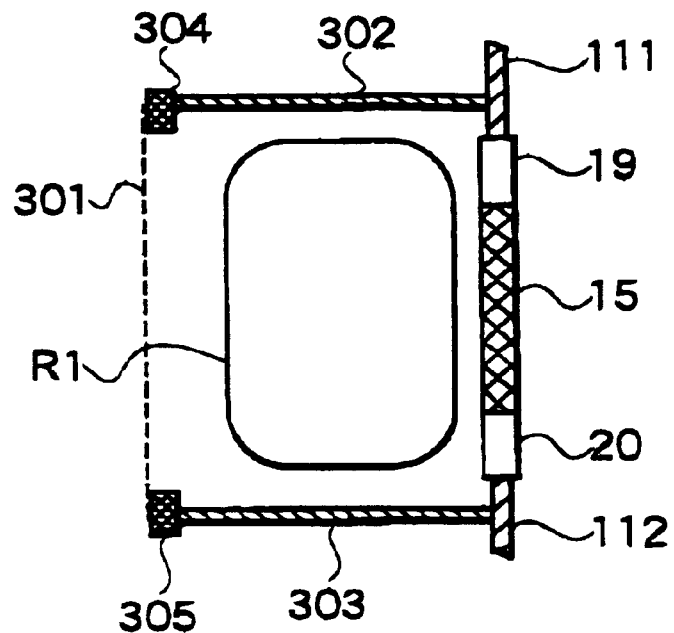
FIG. 3 is a cross-sectional diagram depicting the main components in a second embodiment.

FIG. 3 is a cross-sectional diagram depicting the main components in a second embodiment of the present invention. In FIG. 3, components having more or less the same functions as in FIG. 2 arc designated by the same symbols and detailed descriptions thereof are omitted.

In the embodiment described in the foregoing, cases are described wherein the grid 301 is fixed directly to the partition panels 302 and 303. In this embodiment, however, as diagrammed in FIG. 3, the grid 301 is fixed to the partition panels 302 and 303 via two circular ring-shaped insulators 304 and 305. Here, the insulator 304 is inserted between the upper end of the grid 301 and the inner edge of the partition panel 302, while the insulator 305 is inserted between the lower end of the grid 301 and the inner edge of the partition panel 303.

When such a configuration as this is implemented, it becomes possible to control the electrical characteristics of the grid 301. Thus it is possible to control the electron temperature in the plasma diffusion region R2 using the grid 301.

Third Embodiment

Figure 4:
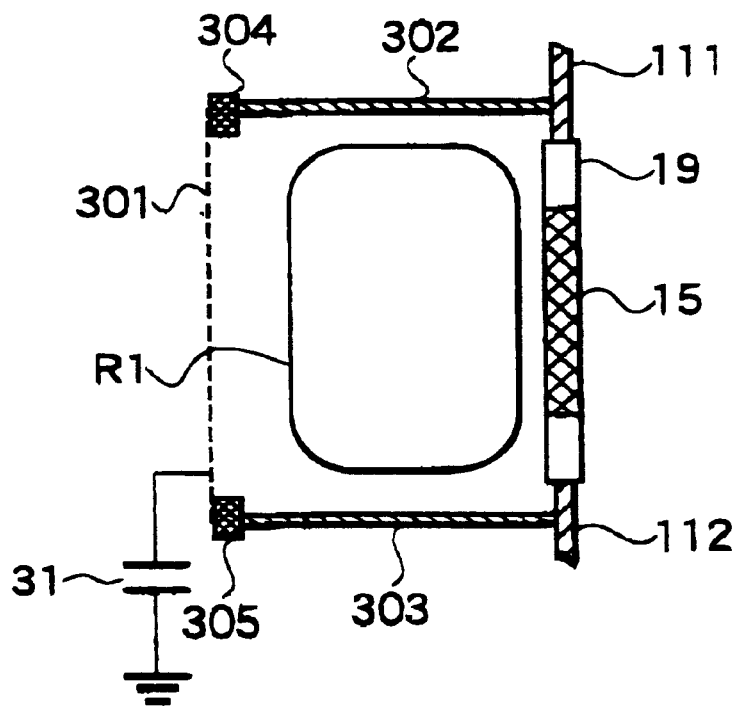
FIG. 4 is a cross-sectional diagram depicting the main components in a third embodiment.

FIG. 4 is a cross-sectional diagram depicting the main components in a third embodiment of the present invention. In FIG. 4, components having more or less the same functions as in FIG. 3 are designated by the same symbols and detailed descriptions thereof are omitted.

This embodiment is the second embodiment wherein, as diagrammed in FIG. 4, a capacitor 31 having an adequately large capacitance is inserted between the grid 301 and ground. In this case, the capacitor 31 may be provided, for example, as a plurality of capacitors. These capacitors 31 are placed evenly around the center axis Z of the vacuum vessel 11.

As based on such a configuration as this, the electron temperature of the plasma in the plasma diffusion region R2 can be lowered to a rather low temperature (to 0.02 eV, for example).

More specifically, with a configuration wherein the capacitor 31 is not inserted, when a high-frequency electric power having a frequency of 13.56 MHz is applied to the discharge electrode 15 to generate the first plasma, the potential on the discharge electrode 15 changes. Because of this, the plasma space potential changes. As a consequence, the potential on the grid 301 changes. Because of this, it is not possible to set the sheath potential generated at the surface of the grid 301 at the desired potential, As a consequence, it is not possible to obtain very low electron temperatures of the plasma in the plasma diffusion region R2.

With this embodiment, on the other hand, because of the capacitor 31, the high-frequency impedance of the grid 301 can be made small. Because of this, the potential on the grid 301 can be kept roughly constant even when the potential on the discharge electrode 15 is changing. As a consequence, it is possible to set the sheath potential generated at the surface of the grid 301 at the desired potential. As a result, rather low electron temperatures can be obtained in the plasma diffusion region R2.

Fourth Embodiment

Figure 5:
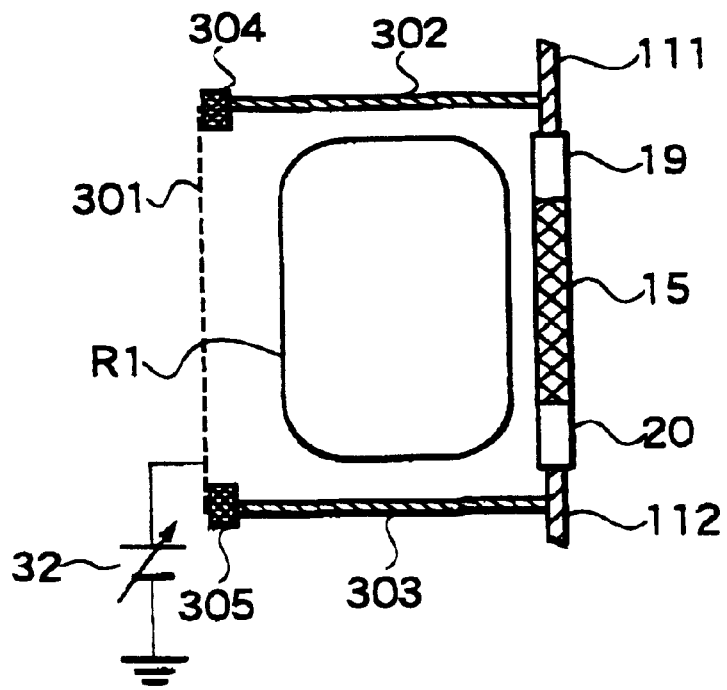
FIG. 5 is a cross-sectional diagram depicting the main components in a fourth embodiment.

FIG. 5 is a cross-sectional diagram depicting the main components in a fourth embodiment of the present invention. In FIG. 5, components having more or less the same fictions as in FIG. 3 above are designated by the same symbols and detailed descriptions thereof are omitted.

This embodiment is the second embodiment, wherein, as diagrammed in FIG. 5, a variable DC power supply 32 is inserted between the grid 301 and ground.

As based on this configuration, by varying the DC voltage output by the variable DC power supply 32, the DC voltage on the grid 301 can be continuously controlled over a wide range, Because of this, the sheath potential generated at the surface of the grid 301 can be controlled continuously over a wide range As a consequence, the electron temperature of the plasma in the plasma diffusion region R2 can be controlled continuously over a wide range. More specifically, this electron temperature can be controlled continuously through a range that varies by a factor of 10 or more.

This is now explained with reference to FIG. 6 and 7. These are characteristic plots that represent test results for this embodiment. These results, moreover, are from tests conducted while supplying no high-frequency electric power to the parallel flat electrodes (upper electrode 21 and lower eletrode 22).

Figure 6:
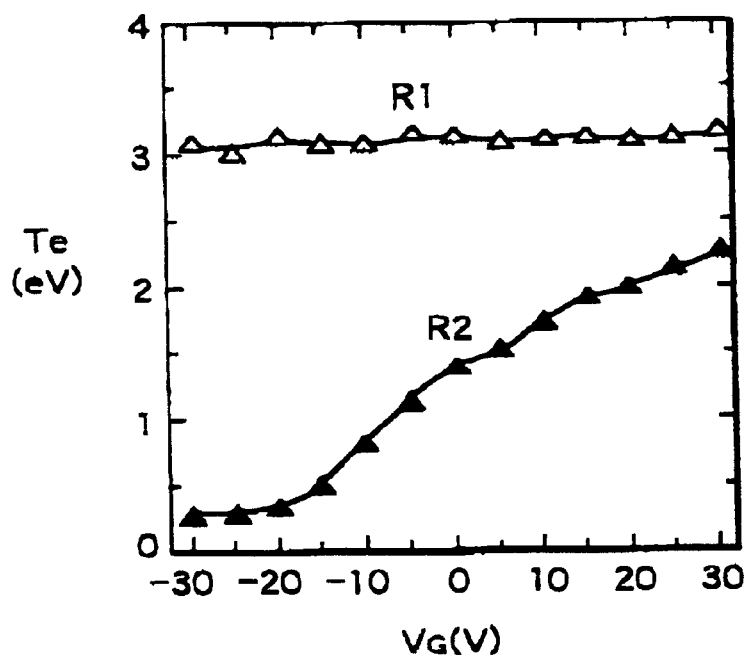
FIG. 6 is a characteristic plot for describing the effectiveness of the fourth embodiment.

FIG. 6 is a characteristic plot showing the dependence of plasma electron temperature $T_e$ (eV) on the DC potential $V_G$ (V=volts) on the grid 301. In FIG. 6, the DC potential $V_G$ is plotted on the horizontal axis and the electron temperature $T_e$ on the vertical axis. As seen in the plot, the electron temperature $T_e$ of the plasma in the plasma generation region R1 hardly changes at all when the DC potential $V_G$ on the grid 301 is varied from −30 V to 30 V. The electron temperature $T_e$ of the plasma in the plasma diffusion region R2, on the other hand, changes from approximately 0.02 eV to approximately 2.3 eV.

Figure 7:
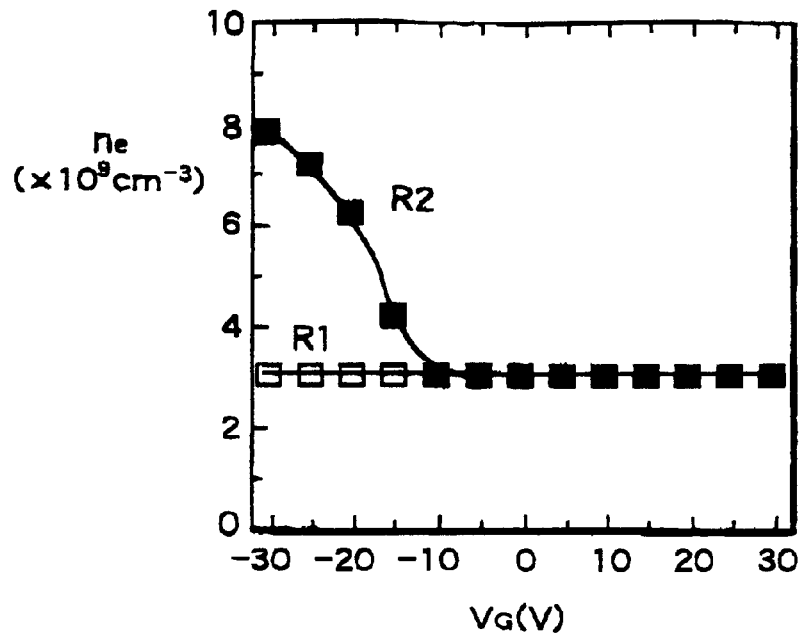
FIG. 7 is a characteristic plot for describing the effectiveness of the fourth embodiment.

FIG. 7 is a characteristic plot showing the dependence of plasma electron density $n_e$ (×10$^9$ cm$^{-3}$) on the DC potential $V_G$ on the grid 301. In this figure, the DC potential $V_G$ on the grid 301 is plotted on the horizontal axis, and the plasma electron density $n_e$ on the vertical axis.

As indicated in FIG. 6 as noted above, in the plasma diffusion region R2, when the DC potential $V_G$ is negative, as this DC potential $V_G$ becomes larger in the negative direction, the plasma electron temperature $T_e$ becomes lower, The plasma electron density $n_e$, on the other hand, becomes larger, as plotted in FIG. 7.

It should be noticed here that, when the electron temperature T. of the plasma in the plasma diffusion region R2 becomes low, the electron density $n_e$ therein becomes higher than the plasma electron density $n_e$ in the plasma generation region R1. The reason therefor is thought to be that the high-energy electrons in the plasma generation region R1 overcome the potential barrier formed by the bias on the grid 301 and move into the plasma diffusion region R2, whereupon they collide with neutral atoms in the plasma diffusion region R2, causing new discharges, thereby generating low-energy plasma.

In an ordinary weakly ionized plasma, the plasma electron density $n_e$ is determined by the balance between plasma generation and diffusion loss. From this fact it is reasoned that, in the plasma diffusion region R2. as the electron temperature $T_e$ becomes lower, diffusion loss decreases, whereupon a plasma electron density $n_e$ is observed that is higher than that in the plasma generation region R1.

In the tests, argon gas was used for the discharge gas. The pressure of this argon gas was 1 mTorr, and the mesh size of the grid 301 was 12 mesh/inch.

The description given above is for cases where the DC potential on the grid 301 is controlled. This embodiment may also be configured so that an AC potential is controlled.

Fifth Embodiment

Figure 8:
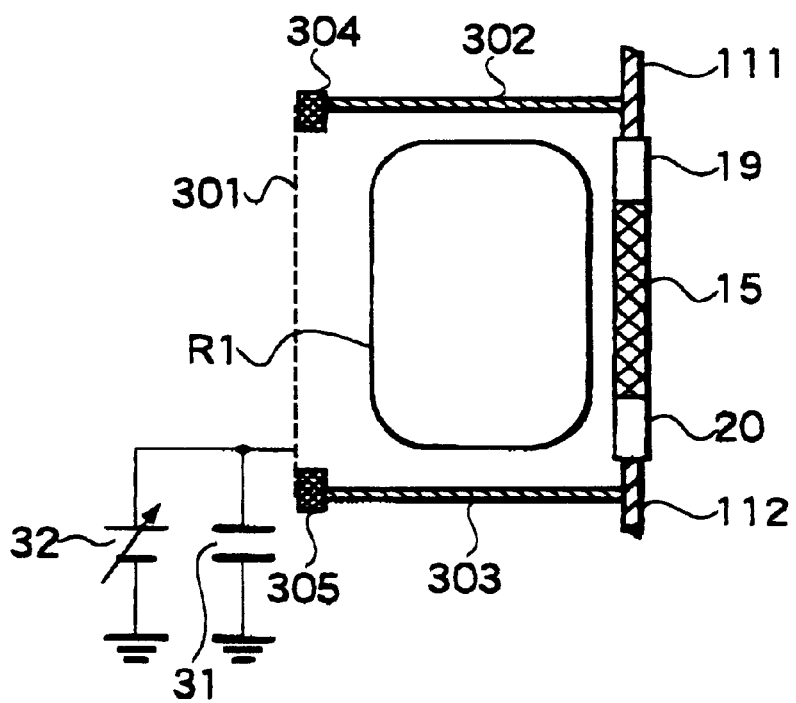
FIG. 8 is a cross-sectional diagram depicting the main components in a fifth embodiment.

FIG. 8 is a cross-sectional diagram depicting the main components in a fifth embodiment of the present invention. In FIG. 8, components having more or less the same functions as in FIG. 4 and FIG. 5 above are designated by the same symbols and detailed descriptions thereof are omitted.

This embodiment is obtained by combining the third embodiment and the fourth embodiment described above, inserting both a capacitor 31 and a variable DC power supply 32 between the grid 301 and ground, as diagrammed in FIG. 8.

As based on this configuration, in addition to being able to lower the electron temperature of the plasma in the plasma diffusion region R2 to a rather low temperature, this electron temperature can be continuously controlled over a wide range.

Sixth Embodiment

Figure 9:
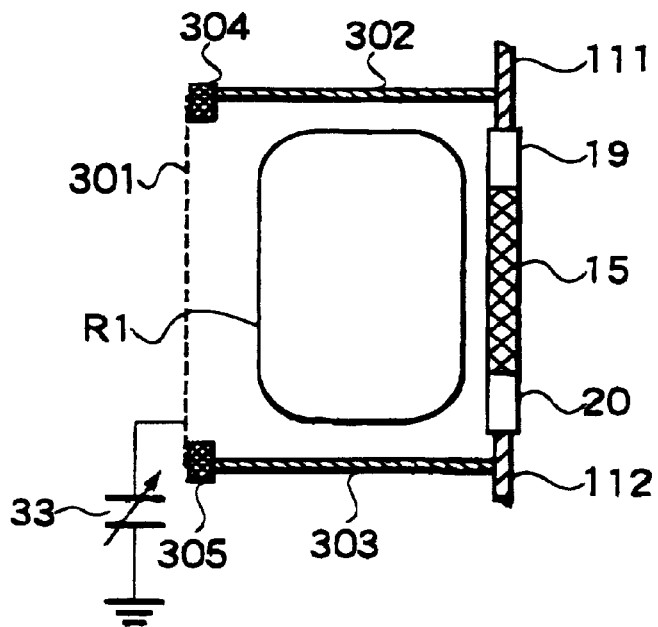
FIG. 9 is a cross-sectional diagram depicting the main components in a sixth embodiment.

FIG. 9 is a cross-sectional diagram depicting the main components in a sixth embodiment of the present invention. In FIG. 9, components having more or less the same functions as in FIG. 3 above are designated by the same symbols and detailed descriptions thereof are omitted.

In the third embodiment described earlier, the description assumes that a fixed capacity capacitor is used as the capacitor 31. This embodiment, however, is configured using a variable capacitance type of capacitor 33.

As based on this configuration, the high-frequency impedance of the grid 301 can be controlled by varying the capacity of the capacitor 33. Because of this, the sheath potential at the surface of the grid 301 can be controlled. As a consequence, the electron temperature of the plasma in the plasma diffusion region P2 can be controlled without being affected by changes in potential on the discharge electrode 15.

This embodiment can be applied not only to the third embodiment diagrammed in FIG. 4, but also to the fifth embodiment diagrammed in FIG. 8.

Seventh Embodiment

Figure 10:
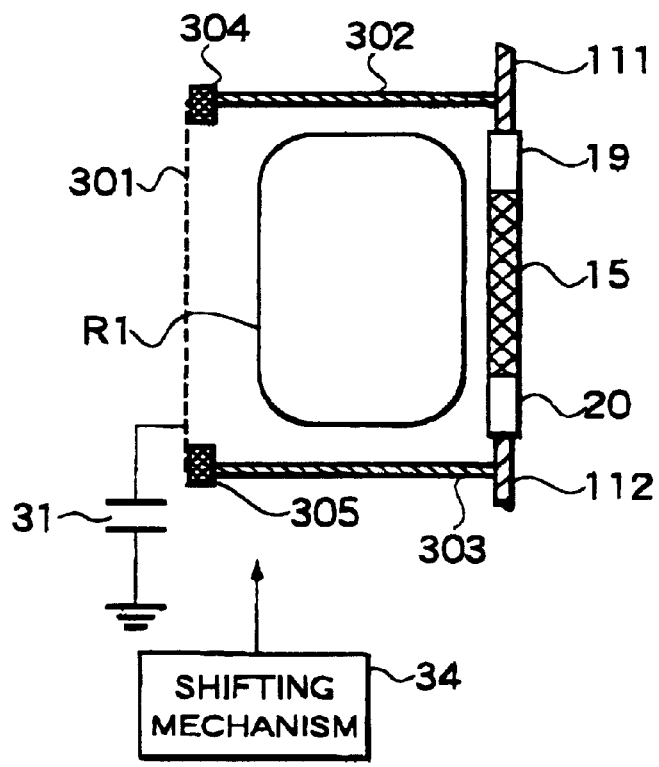
FIG. 10 is a cross-sectional diagram depicting the main components in a seventh embodiment.

FIG. 10 is a cross-sectional diagram depicting the main components in a seventh embodiment of the present invention. In FIG. 10, components having more or less the same functions as in FIG. 4 above are designated by the same symbols and detailed descriptions thereof are omitted.

In this embodiment, the grid 301 is grounded through the capacitor 31, and the grid 301 mesh size (size of the electron passing holes) can be changed.

In this embodiment, in order to change the mesh size, the grid 301 is configured using a two-layer grid structure wherein two grids are stacked together. When such a configuration as this is implemented, the way in which the electron passing holes in the two grids overlap can be changed by shifting the relative positions of the two grids, thus making it possible to change the mesh size in the grid 301.

In FIG. 10, item 34 is a shifting mechanism for shifting the relative position between the two grids. Many different kinds of mechanism are conceivable for this shifting mechanism 34. Accordingly, in the figure, the shifting mechanism 34 is indicated conceptually. In this figure, moreover, the two-layer structure grid 301 is represented as a single grid for convenience.

As based on this configuration, the electron temperature of the plasma in the plasma diffusion region R2 can be controlled by varying the mesh size in the grid 301.

In other words, when the mesh size in the grid 301 is changed, the potential barrier between the individual wires in the grid 301 changes. In this case, as the mesh size in the grid 301 becomes smaller, the potential barrier becomes larger, whereas, as the mesh size becomes larger, the potential barrier becomes smaller. On the other hand, the smaller the mesh size becomes, the larger will become the surface area of the wires of the grid 301, wherefore the probability of highenergy electrons impacting a wire in the grid 301 rises. Therefore, the smaller the mesh size in the grid 301 becomes, the larger will become the sheath potential generated at the surface of the grid 301.

It follows that, the smaller the mesh size in the grid 301, the lower will become the electron temperature of the plasma in the plasma diffusion region R2. Therefore, by changing the grid mesh size, the electron temperature in the plasma diffusion region R2 can be controlled.

Figure 11:
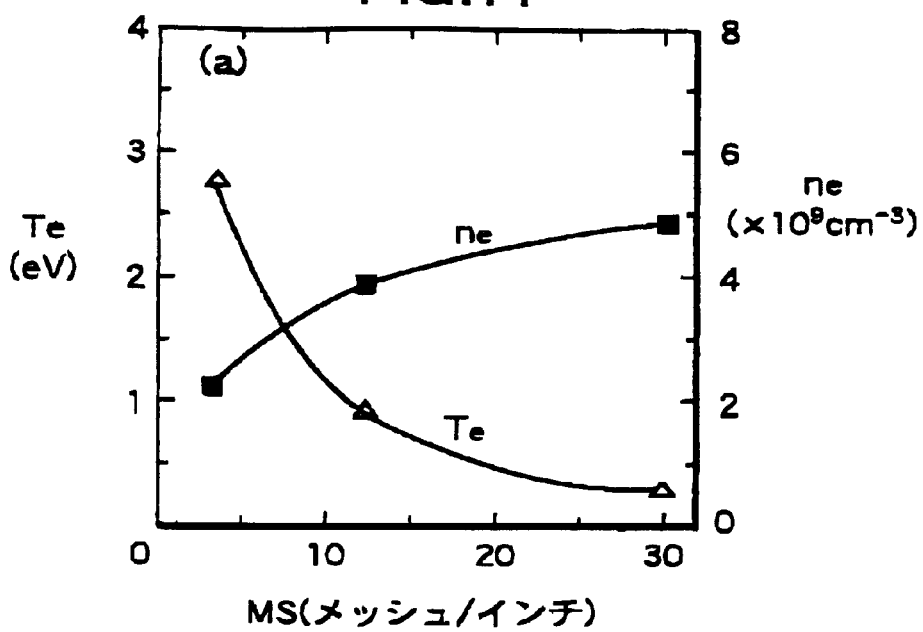

This is now explained with reference to FIG. 11. FIG. 11 is a characteristic plot showing the dependence of the plasma electron temperature $T_e$ and electron density $n_e$ on the mesh size in this embodiment. In FIG. 11 are plotted the results from tests conducted while supplying no high-frequency electric power to the parallel flat electrodes (upper electrode 21 and lower electrode 22). In this figure, mesh size MS (meshes/inch) is plotted on the horizontal axis, while the plasma electron temperature $T_e$ and electron density $n_e$ are plotted on the vertical axis.

As indicated in this plot, by changing the mesh size, the electron temperature $T_e$ of the plasma in the plasma diffusion region R2 can be varied from 0.3 eV to 2.8 eV, approximately, while the plasma electron density n, can be varied from approximately 4.9 ($\times 10^9$ cm$^{-3}$) to 1.0 ($\times 10^9$ cm$^{-3}$).

In the description given above, the electron temperature is controlled by changing the mesh size. In other words, a case is described wherein the electron temperature is controlled by varying the size of the electron passing holes. In this embodiment, however, the electron temperature may also be controlled by changing the number of electron passing holes. Essentially, then, this embodiment may be configured in any way that will allow the electron temperature to be controlled by varying the area of a plurality of electron passing holes.

This embodiment is applicable, moreover, not only to the third embodiment diagrammed in FIG. 4, but to the fourth, fifth, and sixth embodiments diagrammed in FIGS. 5, 8, and 9.

Eighth Embodiment

FIG. 12 is a cross-sectional diagram depicting the main components in an eighth embodiment of the present invention. In FIG. 12, components having more or less the same functions as in FIG. 3 above are designated by the same symbols and detailed descriptions thereof are omitted.

In the embodiments described above, a single cylindrical grid 301 is employed This eighth embodiment, however, is configured so that two cylindrical grids 301 (1) and 301 (2) are used by dividing the grid 301 horizontally.

This embodiment is also configured so that the interval in the vertical dimension between the two grids 301 (1) and 301 (2) can be continually adjusted. In the figure, item 35 is a grid interval adjustment mechanism for adjusting this grid interval d. This grid interval adjustment mechanism 35 may be configured in many different ways. In the figure, therefore, the grid interval adjustment mechanism 35 is indicated conceptually.

In this embodiment, furthermore, capacitors 36 and 37 are inserted between the grids 301 (1) and 301 (2), respectively, and ground.

As based on such a configuration as this, the electron temperature $T_e$ in the plasma diffusion region R2 can be controlled by varying the interval d between two grids 301 (1) and 301 (2).

More specifically, when the interval d between the two grids 301 (1) and 301 (2) is changed, the potential distribution barrier formed between the two grids 301 (1) and 301 (2) changes. In this case, when the distance d between the two grids 301 (1) and 301 (2) is made larger, the potential barrier becomes smaller, and when the interval d is made smaller, the potential barrier becomes larger.

When the potential barrier becomes small, it becomes possible for even those electrons having low potential energy to overcome the potential barrier and enter the plasma diffusion region R2. Thus, in this case, the electron energy distribution of the plasma in the plasma diffusion region R2 becomes broader, and the electron temperature rises.

When, on the other hand, the potential barrier becomes large, electrons of low potential energy are not able to overcome the potential barrier and enter the plasma diffusion region R2. Thus, in this case, the electron energy distribution becomes narrower in the plasma in the plasma diffusion region R2, and the electron temperature declines.

It follows from the foregoing that, by controlling the interval d between the two grids 301 (1) and 301 (2), the plasma electron temperature in the plasma diffusion region R2 can be controlled, FIG. 13 is a characteristic plot showing the dependency of the plasma electron temperature $T_e$ in the plasma diffusion region R2 on the grid interval d.

FIG. 13 represents the results obtained from tests conducted while supplying no high-frequency electric power to the parallel flat electrodes (upper electrode 21 and lower electrode 22).

In this figure, the grid interval d (mm) is plotted on the horizontal axis, and plasma electron temperature $T_e$ on the vertical axis. Zd is the interval between the parallel flat electrodes, that is, the interval in the direction of the center axis Z of the vacuum vessel 11. In the case represented in the figure, Zd is 10 cm.

As diagrammed, in this embodiment, by varying the grid interval d from 10 mm to 0 mm. approximately, the plasma electron temperature $T_e$ can be varied from approximately 2.8 eV to 0.2 eV. In these tests, argon gas was used as the discharge gas. The pressure of the argon gas was 3 mTorr and the wattage of the high-frequency power supplied to the discharge electrode 15 was 100 W.

As based on this embodiment, moreover, it is possible to make the plasma electron density, the plasma space potential, and the plasma electron temperature distribution uniform. This is now explained with reference to FIG. 14. FIG. 14 is a characteristic plot showing the distributions of the plasma electron density $n_e$ in the plasma diffusion region R2, the plasma space potential $V_g$, and the plasma electron temperature $T_e$. FIG. 14 represents the results of measuring distributions in the axial dimension of the vacuum vessel 11.

In this figure, the distance r (cm) in the axial direction from the center of the vacuum vessel 11 is plotted on the horizontal axis, while the plasma electron density $n_e$, plasma space potential $V_g$ (×10 V), and plasma electron temperature $T_g$ are plotted on the vertical axis. Zd represents the interval between the parallel flat electrodes. In the case represented in this figure, Zd is 10 cm and the grid interval d is 0 mm.

As diagrammed here, in this embodiment, the plasma electron density $n_e$, plasma space potential $V_g$, and plasma electron temperature $T_e$ all exhibit uniform distributions in a range for the distance r below approximately 12 cm.

As based on this embodiment, moreover, with a comparatively simple configuration wherein the grid interval d alone is varied continuously, the electron temperature $T_e$ of the plasma in the plasma diffusion region R1 can be controlled continuously.

As based on this embodiment, furthermore, there is no need to apply a bias to the grids 301 (1) and 301 (2). Therefore, in processes wherein reaction gases are used, the plasma electron temperature $T_e$ in the plasma diffusion region R2 can be controlled even when an insulating film is formed on the surfaces of the grids 301 (1) and 301 (2).

Ninth Embodiment

FIG. 15 is a cross-sectional diagram of a ninth embodiment of the present invention. In FIG. 15, components having more or less the same functions as in FIG. 4 above are designated by the same symbols and detailed descriptions thereof are omitted.

In the embodiments described earlier, the interval between the grid 301 and the discharge electrode 15 is made constant. In this embodiment, however, this grid-discharge electrode interval can be adjusted. Many different mechanisms are conceivable for this grid-discharge electrode interval adjusting mechanism 36. In the figure, therefore, this grid-discharge electrode adjustment mechanism 36 is indicated conceptually.

As based on such a configuration as this, the interval between the grid 301 and the discharge electrode 15 can be varied. This makes it possible to control the electron temperature of the plasma in the plasma diffusion region R2.

More specifically, by varying the interval between the grid 301 and the discharge electrode 15, the sheath potential generated at the surface of the grid 301 can be controlled. Because of this, the potential barrier formed by the grid 301 can be controlled also. As a consequence, the energy possessed by the electrons capable of overcoming this potential barrier changes. Thus it is possible to control the electron temperature in the plasma diffusion region.

As based on this embodiment, moreover, it is possible to prevent the plasma generation efficiency from declining and the apparatus size from becoming too large.

More specifically, when the interval between the grid 301 and the discharge electrode 15 is too small, discharges occur between the grid 301 and the discharge electrode 15. Because of this, the plasma generation efficiency declines. Conversely, when that interval is too large, the apparatus has to be larger. It follows from the foregoing that, by adjusting the interval between the grid 301 and the discharge electrode 15, it is possible to prevent the plasma generation efficiency from declining and the apparatus size from becoming too large.

This embodiment may be applied not only to the third embodiment diagrammed in FIG. 4, but also to the embodiments diagrammed in FIGS. 3, 5, 8, 9, 10, and 12, Tenth Embodiment FIG. 16 is a cross-sectional diagram of an tenth embodiment of the present invention. In FIG. 15, components having more or less the same functions as in FIG. 4 above are designated by the same symbols and detailed descriptions thereof are omitted.

In the embodiments described earlier, the grid 301 is set so that it is parallel to the center axis Z of the vacuum vessel 11. In this embodiment, however, as diagrammed in FIG. 16, the grid 301 is set diagonally relative to the center axis of the vacuum vessel 11 so that it faces the substrate W. Such a grid 301 can easily be configured by a section cut from the upper part of a circular cone.

When such a configuration as this is implemented, the plasma density at the surface of the substrate W can be raised, making it possible to raise substrate W process efficiency.

This embodiment may be applied not only to the third embodiment diagrammed in FIG. 4, but also to the embodiments diagrammed in FIGS. 3, 5, 8, 9, 10, 12, and 15.

Other Embodiments

Nine embodiments of the present invention are described in the foregoing. However, the present invention is not limited by or to the described embodiments.

(1) In the embodiments described in the foregoing, for example, a grid 301 having electron passing holes arranged on it is used as the wall exhibiting electrical conductivity, but, in the present invention, a wall may be used wherein the electron passing holes are arranged in a single line rather than in a lattice pattern. Such a configuration can be used in cases where a wall is used that has slit-shaped electron passing holes, for example.

(2) In the embodiments described in the foregoing, moreover, the present invention is applied in a magnetron high-frequency discharge plasma generation apparatus having parallel flat electrodes. However, the present invention can also be applied in magnetron high-frequency discharge plasma generation apparatuses that do not have parallel flat electrodes.

(3) In the embodiments described in the foregoing, furthermore, the present invention is applied in a magnetron high-frequency discharge plasma generation apparatus having ring-shaped permanent magnets. However, the present invention can also be applied in magnetron high-frequency discharge plasma generation apparatuses that do not have permanent magnets.

(4) In the embodiments described in the foregoing, moreover, the present invention is applied in a magnetron high-frequency discharge plasma generation apparatus. However, the present invention can be applied in negative ion plasma generation apparatuses and in high-density plasma generation apparatuses such as ECR plasma generation apparatuses, inductively coupled plasma generation apparatuses, micro-surface wave plasma generation apparatuses, and helicon wave plasma generation apparatuses.

(5) Needless to say, the present invention may be modified in various ways within such range as the essence of the invention is not compromised.

Based on the plasma generation apparatus cited in claim 1, as described in the foregoing, the interior region of the vacuum vessel can be divided between a plasma generation region and a plasma diffusion region, in a direction perpendicular to the center axis of the vacuum vessel. Therefore, even in cases where the dimensions of the process object are large, it is possible to prevent the electron temperature distribution at the surface of the process object from becoming uneven due to deformation of the wall.

Based on the present invention, moreover, the interior region of the vacuum vessel can be divided into a plasma generation region and a plasma diffusion region, thus making it possible to enhance the controllability of the plasma at the surface of the process object.

Based on the present invention, furthermore, the region division means are provided close to the discharge electrode, thereby making it possible to effectively control the plasma electron temperature in the plasma diffusion region.

Based on the present invention, moreover, the region division means are located in a position that is on the outside of the process object, thereby making it possible to effect plasma processing uniformly over the entire surface of the process object.

What is claimed is:

1. A plasma generation apparatus comprising:
    a tube-shaped vacuum vessel;
    a gas introducer introducing a discharge gas into an interior of said vacuum vessel;
    an atmosphere exhauster exhausting atmosphere in the interior of said vacuum vessel;
    a ring-shaped discharge electrode, provided concentrically with said vacuum vessel, for generating a plasma inside of said vacuum vessel by causing said discharge gas to discharge;
    a discharge electric power supply supplying discharge electric power to said discharge electrode to cause said discharge gas to discharge;
    a region divider having a tube-shaped wall that has a plurality of electron passing holes, and that is placed concentrically with said vacuum vessel so that it is positioned outside a position where a process object is placed said divider dividing an interior region of said vacuum vessel, into a plasma generation region and a plasma diffusion region, by covering an inside of said discharge electrode in a vicinity of said discharge electrode using said wall; and
    an electron temperature controller controlling electron temperature of the plasma in said plasma diffusion region.

2. The plasma generation apparatus according to claim 1, wherein said wall exhibits electrical conductivity.

3. The plasma generation apparatus according to claim 2, wherein said electron temperature controller comprises an insulator electrically insulating said wall from a reference potential point.

4. The plasma generation apparatus according to claim 3, wherein said electron temperature controller comprises a capacitive element inserted between said wall and said reference potential point.

5. The plasma generation apparatus according to claim 3, wherein said electron temperature controller comprises a potential controller for controlling potential on said wall.

6. The plasma generation apparatus according to claim 3, wherein said electron temperature controller comprises a capacitive element inserted between said wall and said potential reference point, and a potential controller for controlling potential on said wall.

7. The plasma generation apparatus according to claim 4, wherein said capacitive element is a variable capacitive element.

8. The plasma generation apparatus according to claim 6, wherein said capacitive element is a variable capacitive element.

9. The plasma generation apparatus according to claim 5, wherein said potential controller controls DC potential on said wall.

10. The plasma generation apparatus according to claim 6, wherein said potential controller controls DC potential on said wall.

11. The plasma generation apparatus according to claim 1, wherein said electron temperature controller comprises an area adjuster adjusting a total area of said plurality of electron passing holes.

12. The plasma generation apparatus according to claim 1, wherein said wall is divided so that it comprises a plurality of small walls, and said electron temperature control means comprises an interval adjuster adjusting an interval between said plurality of small walls.

13. The plasma generation apparatus according to claim 1, wherein said electron temperature controller comprises an interval adjuster capable of adjusting an interval between said wall and said discharge electrode.

14. The plasma generation apparatus according to claim 1, wherein an interval between said wall and said discharge electrode is set so that no abnormal discharges are generated therebetween.

15. The plasma generation apparatus according to claim 1, wherein said wall is set so as to be parallel with the center axis of said vacuum vessel.

16. The plasma generation apparatus according to claim 1, wherein said wall is placed diagonally relative to the center axis of said vacuum vessel so as to face toward said process object.

17. The plasma generation apparatus according to claim 1, wherein said wall is coated by a dielectric.

18. The plasma generation apparatus according to claim 1, wherein said region divider comprises:
    a first ring-shaped partition panel, an outer edge of which is fixed on an inner wall side of said vacuum vessel, to an inner edge of which is fixed one end of said wall; and
    a second ring-shaped partition panel, positioned so as to sandwich said discharge electrode together with said first partition panel, an outer of edge of which is fixed on the inner wall side of said vacuum vessel, to an inner edge of which is fixed another end of said wall.

19. The plasma generation apparatus according to claim 1, wherein an arrangement of said plurality of electron passing holes is a lattice pattern.

* * * * *